United States Patent
Boulanger (10) Patent No.: US 8,939,408 B2
(45) Date of Patent: Jan. 27, 2015

(54) HYBRID ASSEMBLY EQUIPPED WITH AT LEAST ONE SOLAR PANEL

(75) Inventor: Bernard Boulanger, Frejus (FR)

(73) Assignee: Thales, Neuilly-sur-Seine (FR)

( * ) Notice: Subject to any disclaimer, the term of this patent is extended or adjusted under 35 U.S.C. 154(b) by 392 days.

(21) Appl. No.: 13/530,485

(22) Filed: Jun. 22, 2012

(65) Prior Publication Data

US 2012/0325975 A1 Dec. 27, 2012

(30) Foreign Application Priority Data

Jun. 23, 2011 (FR) ...................... 11 01933

(51) Int. Cl.
*B64G 1/44* (2006.01)
*H01L 31/052* (2014.01)
*H02S 30/20* (2014.01)

(52) U.S. Cl.
CPC ............ *B64G 1/443* (2013.01); *H01L 31/0522* (2013.01); *H01L 31/045* (2013.01); *Y02E 10/52* (2013.01)
USPC ...................... 244/172.8; 244/172.7; 136/246

(58) Field of Classification Search
USPC ......... 244/172.8, 172.7, 158.1; 136/246, 247, 136/248
See application file for complete search history.

(56) References Cited

U.S. PATENT DOCUMENTS

| | | | |
|---|---|---|---|
| 5,269,288 A * | 12/1993 | Stirbl et al. .................... | 126/593 |
| 5,959,787 A | 9/1999 | Fairbanks | |
| 6,075,200 A | 6/2000 | O'Neill | |
| 6,188,012 B1 | 2/2001 | Ralph | |
| 6,655,638 B2 * | 12/2003 | Deel .......................... | 244/172.8 |
| 6,695,984 B1 | 2/2004 | Odaka et al. | |
| 7,077,361 B1 * | 7/2006 | Rabinowitz ................ | 244/172.8 |
| 2003/0192998 A1 * | 10/2003 | Davidson et al. ............ | 244/172 |
| 2004/0134531 A1 * | 7/2004 | Habraken et al. ............ | 136/246 |
| 2010/0116942 A1 * | 5/2010 | Fitzgerald et al. .......... | 244/172.7 |
| 2012/0174582 A1 * | 7/2012 | Moussavi ..................... | 60/641.8 |
| 2013/0255753 A1 * | 10/2013 | Escher et al. ................. | 136/248 |
| 2014/0026945 A1 * | 1/2014 | Correia et al. ................ | 136/248 |
| 2014/0174504 A1 * | 6/2014 | Fangman et al. ............. | 136/248 |

FOREIGN PATENT DOCUMENTS

| | | |
|---|---|---|
| WO | 00/07959 A1 | 2/2000 |
| WO | 02/08058 A1 | 1/2002 |
| WO | 2007/041018 A2 | 4/2007 |
| WO | 2008/098279 A1 | 8/2008 |

* cited by examiner

*Primary Examiner* — Christopher P Ellis
(74) *Attorney, Agent, or Firm* — Baker & Hostetler LLP (57) ABSTRACT

A spacecraft comprises a hybrid assembly equipped with at least one solar panel characterized in that said assembly comprises at least one solar cell provided with luminous energy concentration means and said assembly also comprises at least one solar cell with no luminous energy concentration means.

7 Claims, 6 Drawing Sheets

HYBRID ASSEMBLY EQUIPPED WITH AT LEAST ONE SOLAR PANEL

CROSS-REFERENCE TO RELATED APPLICATION

This application claims priority to foreign French patent application No. FR 1101933, filed on Jun. 23, 2011, the disclosure of which is incorporated by reference in its entirety.

FIELD OF THE INVENTION

The present invention relates to a hybrid assembly equipped with at least one solar panel.

BACKGROUND

Figure 1A:
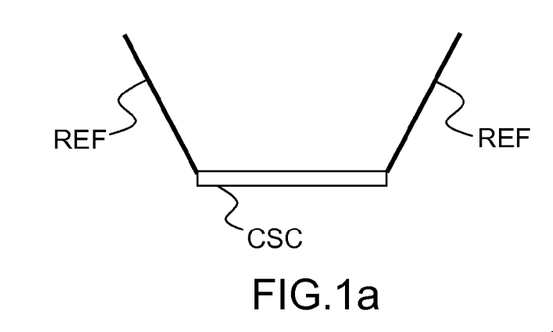
FIGS. 1a and 1b show diagrammatically a prior art solar panel produced with solar cells provided with reflectors.
Figure 1B:
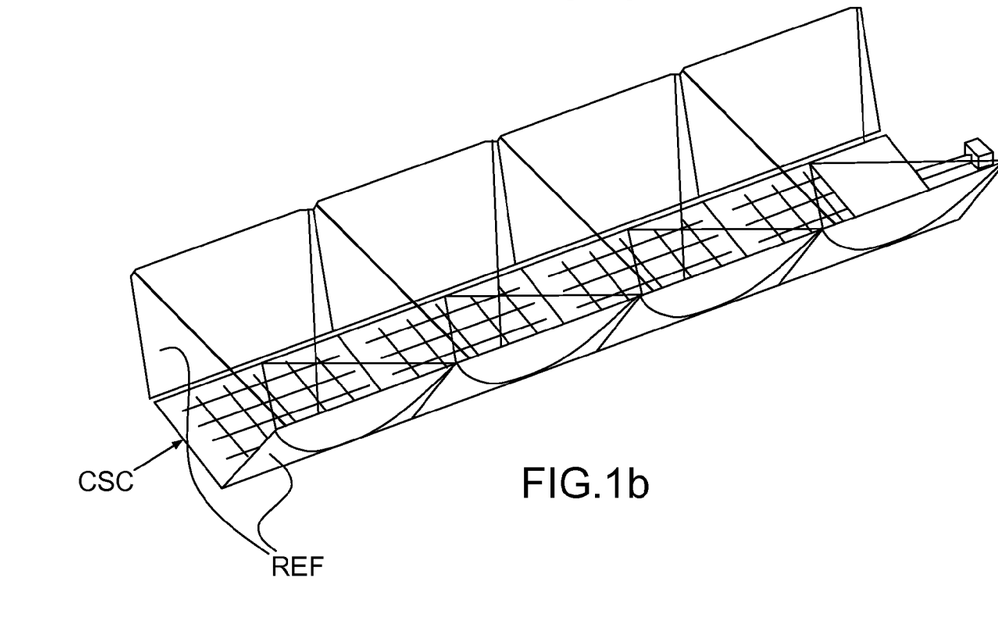

It is known to use solar panels produced with solar cells CSC provided with means Conc for concentration of luminous energy or solar energy, such as reflectors Ref as shown in FIGS. 1a and 1b. Such systems have been used on Boeing HS702 satellites.

Figure 2:
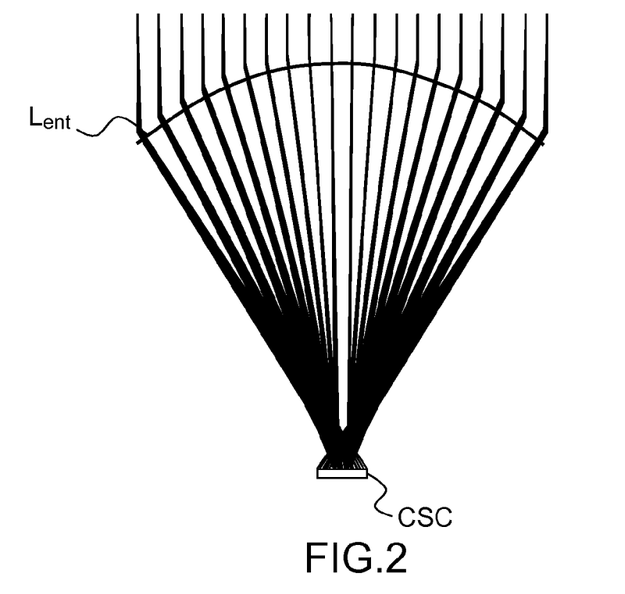
FIG. 2 shows diagrammatically a solar cell provided with a concentrator produced in the form of a lens.

Also known are solar panels produced with solar cells CSC provided with luminous energy concentration means Conc, such as concentrators produced by means of lenses Lent as in Stretched Lens Array (SLA) systems, as shown in FIG. 2. The lens Lent concentrates the luminous energy on the solar cell CSC. Such systems are described for example in the patent documents U.S. Pat. No. 6,188,012 (Tecstar), WO 00/7959 (AEC-ABLE) or WO 02/08058 (CSL), or U.S. Pat. No. 6,075,200 (ENTECH).

The use of solar panels for satellites with solar cells provided with concentration means is known but gives rise to problems, notably during depointing, during which the electrical energy created becomes very low, because this type of cell generally has a somewhat binary energy efficiency according to pointing or depointing relative to the source of luminous energy.

By depointing is meant an angular deviation between the direction of the beam of luminous energy emitted by the luminous source, in this instance the sun, and the receiving face of the solar cell.

Also, in the event of depointing of solar panels of satellites, notably during the phases of placing a satellite on station or when a satellite has lost its nominal attitude, the electrical energy or electrical current supplied by the solar generator to the satellite is very low.

SUMMARY OF THE INVENTION

An object of the invention is notably to be able to avoid the very serious losses of electrical energy delivered, notably during depointing, for example during phases of placing a satellite on station or when a satellite has lost its nominal attitude, the electrical energy or electrical current supplied by the solar generator to the satellite then being very low.

Another application of this invention, where systems with concentration are very suitable, may concern spacecraft the solar illumination whereof varies greatly during its mission and goes for example from standard illumination in terrestrial orbit to low illumination in deep space.

There is proposed, according to one aspect of the invention, a spacecraft comprising a hybrid assembly equipped with at least one solar panel. The assembly comprises at least one solar cell provided with luminous energy concentration means and at least one solar cell with no luminous energy concentration means.

Such a spacecraft provided with such a hybrid assembly makes it possible to avoid the very serious losses of electrical energy delivered, notably during depointing, for example during phases of placing a satellite on station or when a satellite has lost its nominal attitude.

In one embodiment, said luminous energy concentration means comprise at least one reflector.

The reflectors may be shared for a plurality of solar cells or dedicated to only one solar cell.

The benefit is to reduce the number of cells, which are very costly, and therefore to reduce the cost of these systems.

In one embodiment, said luminous energy concentration means comprise at least one concentrator.

The use of concentrators, such as optical lenses, enables the solar energy transmitted to the solar cells to be greatly increased, and therefore the electrical energy delivered by the solar cells to be greatly increased, for example of the order of ten times more than without concentrators.

Cost is therefore reduced.

For example, such a lens is a Fresnel lens and comprises at least one part in pliable flexible material and a device for deployment of said lens.

Thus it is possible to reduce the number of very costly cells and the cost of the system.

In one embodiment, the hybrid assembly comprises at least one solar panel provided exclusively with solar cells provided with luminous energy concentration means and at least one solar panel provided exclusively with solar cells with no luminous energy concentration means.

Such an embodiment enables the cost of manufacturing the solar panels of the hybrid assembly to be limited, because a solar panel comprises either only solar cells provided with luminous energy concentration means or only solar cells with no luminous energy concentration means.

According to another aspect of the invention, there is also proposed a method of generation of electrical energy for spacecraft by hybridization of electrical energy produced by at least one solar cell provided with luminous energy concentration means and at least one solar cell with no luminous energy concentration means.

BRIEF DESCRIPTION OF THE DRAWINGS

The invention will be better understood after studying a few embodiments described by way of nonlimiting example and illustrated by the appended drawings, in which.

In the various figures, elements having identical references are similar.

DETAILED DESCRIPTION

Figure 3:
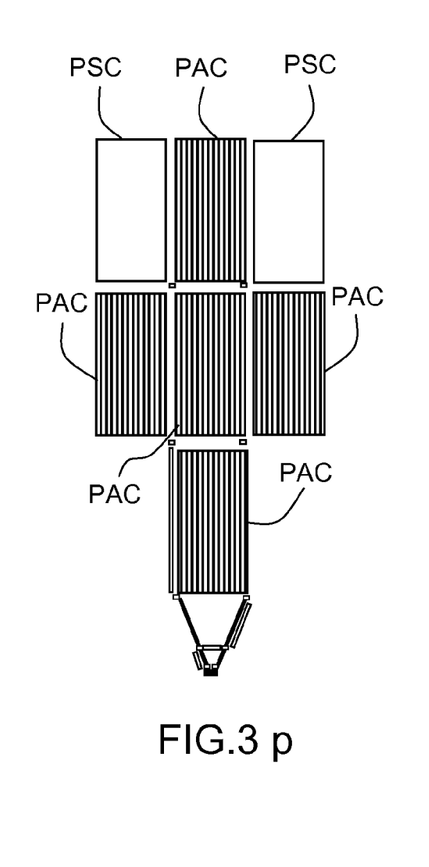
FIGS. 3a, 3b, 3c, 3d, 3e, 3f, 3g, 3h, 3i, 3j, 3k, 3l, 3m, 3n, 3o, 3p, 3q show diagrammatically a hybrid assembly equipped with at least one solar panel provided exclusively with solar cells provided with luminous energy concentration means and at least one solar panel provided exclusively with solar cells with no luminous energy concentration means.
Figure 3A:
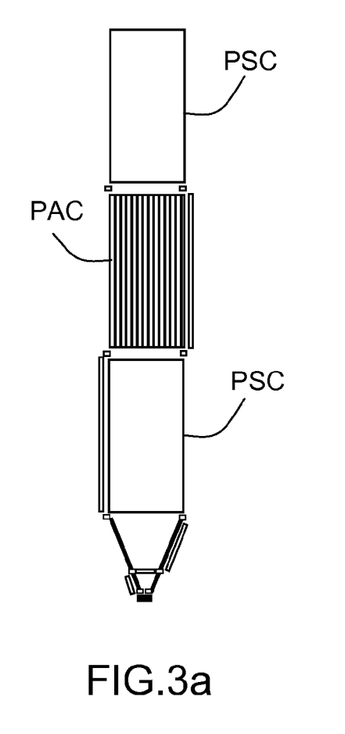
Figure 3B:
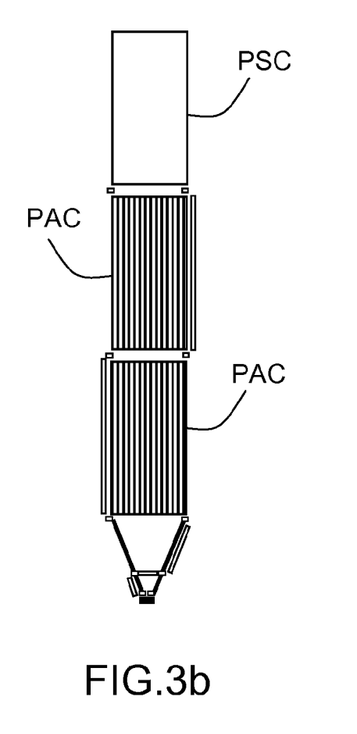
Figure 3C:
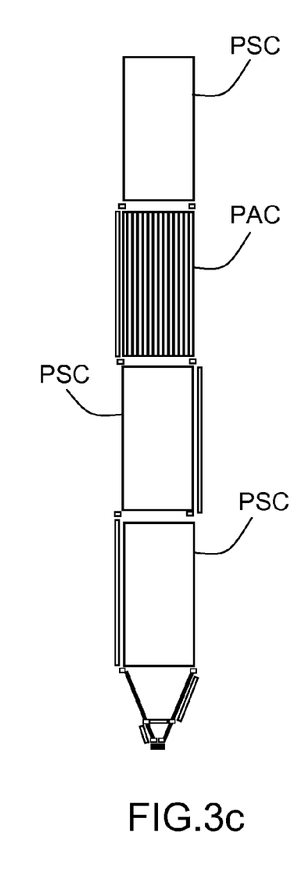
Figure 3D:
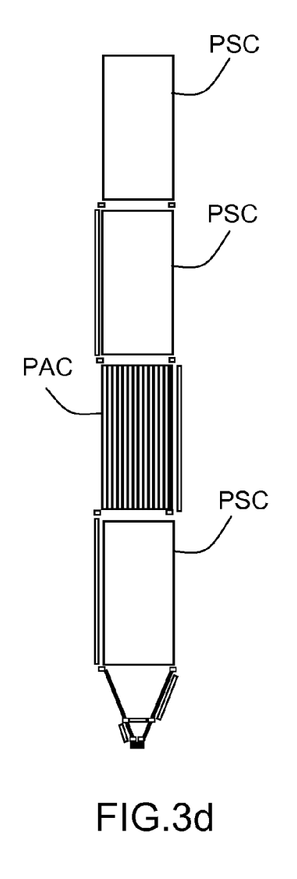
Figure 3E:
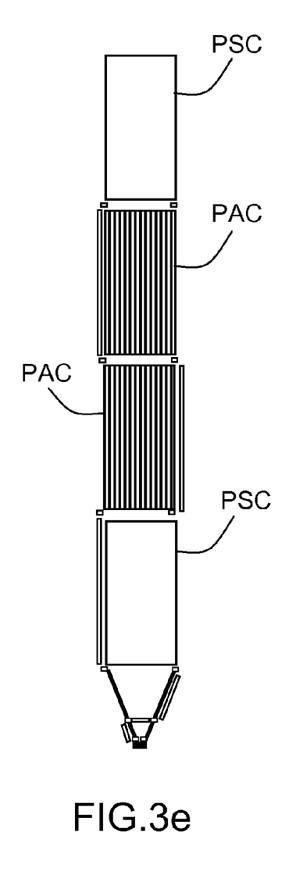
Figure 3F:
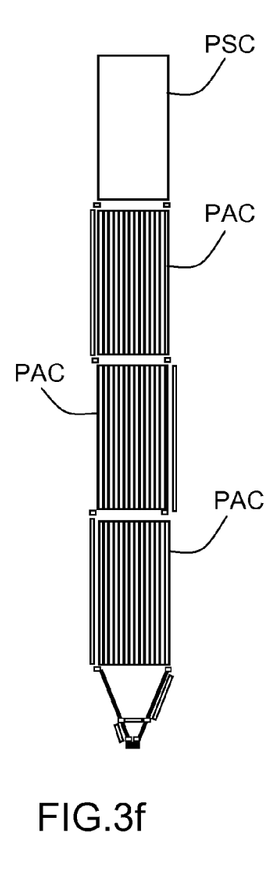
Figure 3G:
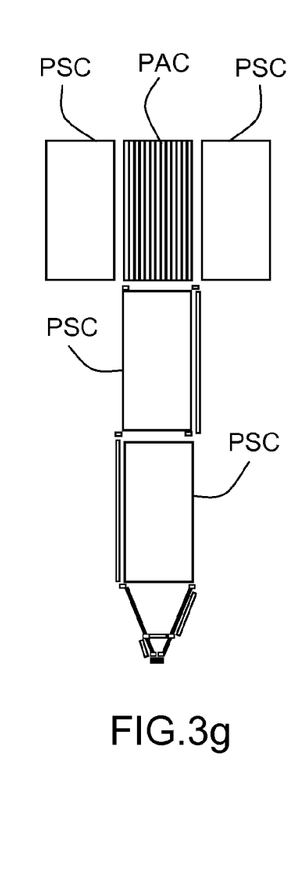
Figure 3H:
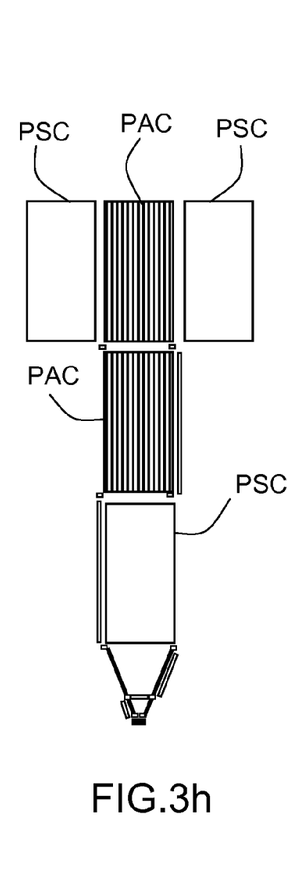
Figure 3I:
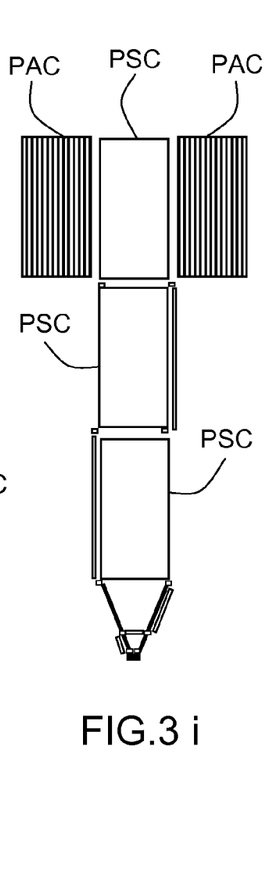
Figure 3J:
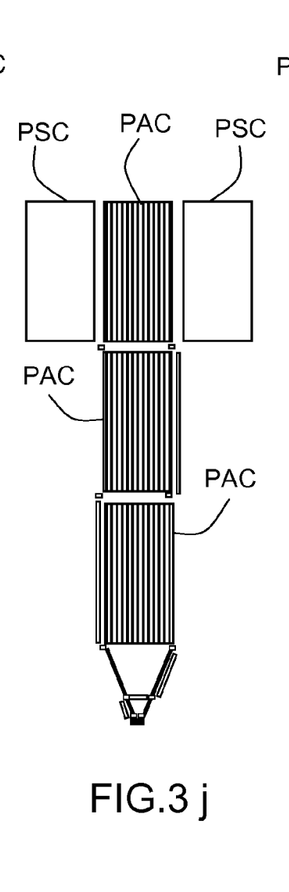
Figure 3K:
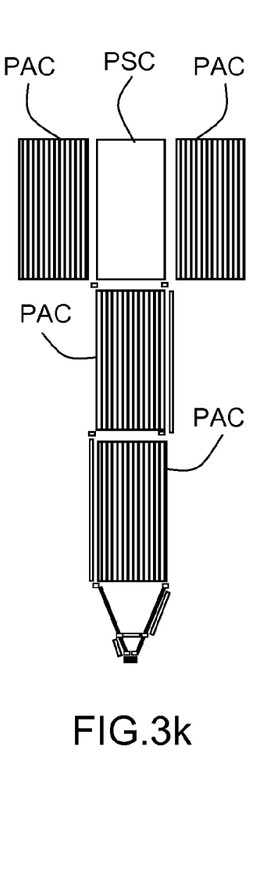
Figure 3L:
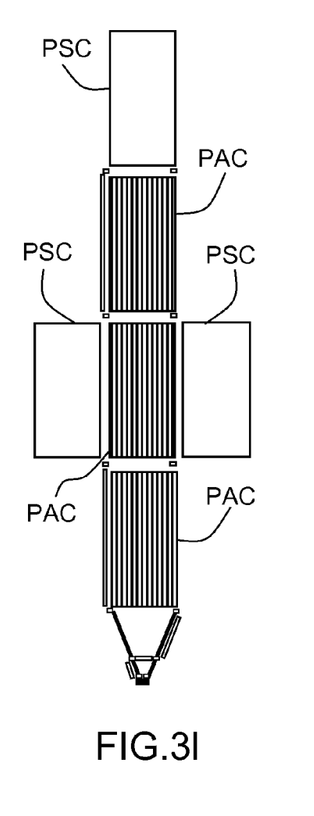
Figure 3M:
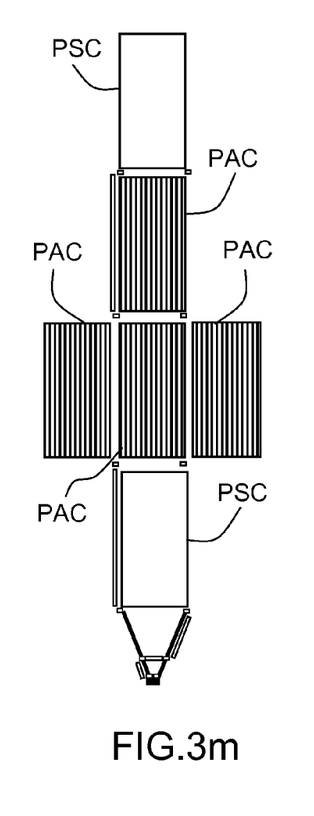
Figure 3N:
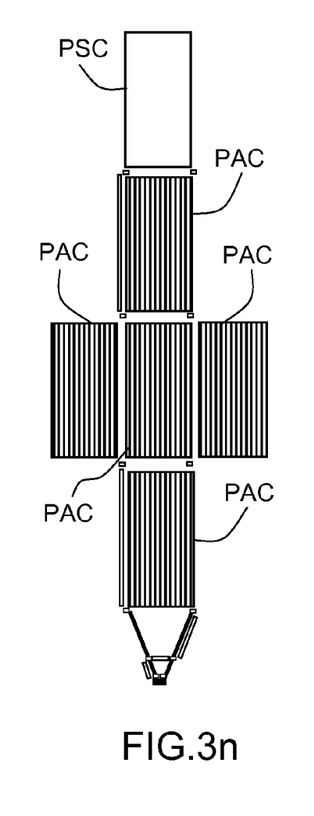
Figure 3O:
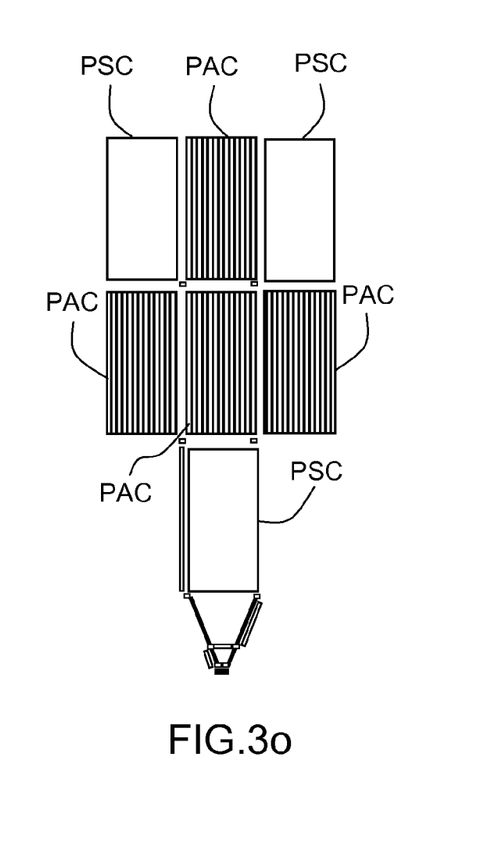
Figure 3Q:
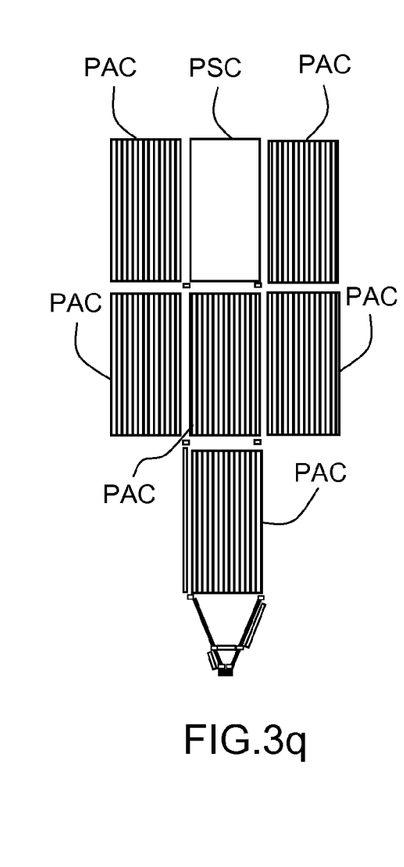

FIGS. 3a to 3q show satellite solar generator wings comprising at least one solar panel provided exclusively with solar cells provided with luminous energy concentration means and at least one solar panel provided exclusively with solar cells with no luminous energy concentration means. Of course, these embodiments are not limiting.

FIG. 3a shows a solar generator wing GS provided with three solar panels arranged in linear fashion, of which one panel PAC is provided exclusively with solar cells provided with luminous energy concentration means, disposed between two other solar panels PSC provided exclusively with solar cells with no luminous energy concentration means.

During a phase with depointing, such a solar generator wing thus provides one third less electrical energy, because the solar panel PAC provided exclusively with solar cells provided with luminous energy concentration means no longer supplies electrical energy.

FIG. 3b shows a solar generator wing GS provided with three solar panels arranged in linear fashion, of which two panels PAC are provided exclusively with solar cells provided with luminous energy concentration means, disposed contiguously, at the end of the wing attached to the satellite, and one solar panel PSC is provided exclusively with solar cells with no luminous energy concentration means.

During a phase with depointing, such a solar generator wing thus provides two thirds less electrical energy, because the two solar panels PAC provided exclusively with solar cells provided with luminous energy concentration means no longer supply electrical energy.

FIG. 3c shows a solar generator wing GS provided with four solar panels arranged in linear fashion, of which one panel PAC is provided exclusively with solar cells provided with luminous energy concentration means, disposed at the third position with numbering of positions starting from the end of the wing attached to the satellite, and three solar panels PSC are provided exclusively with solar cells with no luminous energy concentration means.

During a phase with depointing, such a solar generator wing thus supplies one quarter less electrical energy, because the solar panel PAC provided exclusively with solar cells provided with luminous energy concentration means no longer supplies electrical energy.

FIG. 3d shows a solar generator wing GS provided with four solar panels arranged in linear fashion, of which one panel PAC is provided exclusively with solar cells provided with luminous energy concentration means, disposed in the second position with numbering of positions starting from the end of the wing attached to the satellite, and three solar panels PSC are provided exclusively with solar cells with no luminous energy concentration means.

During a phase with depointing, such a solar generator wing thus supplies one quarter less electrical energy, because the solar panel PAC provided exclusively with solar cells provided with luminous energy concentration means no longer supplies electrical energy.

FIG. 3e shows a solar generator wing GS provided with four solar panels arranged in linear fashion, of which two panels PAC are provided exclusively with solar cells provided with luminous energy concentration means, disposed at second and third positions, with numbering of positions starting from the end of the wing attached to the satellite, and two solar panels PSC are provided exclusively with solar cells with no luminous energy concentration means.

During a phase with depointing, such a solar generator wing thus provides half as much electrical energy, because the two solar panels PAC provided exclusively with solar cells provided with luminous energy concentration means no longer supply electrical energy.

FIG. 3f shows a solar generator wing GS provided with four solar panels arranged in linear fashion, of which three panels PAC are provided exclusively with solar cells provided with luminous energy concentration means, disposed in first, second and third positions with numbering of positions starting from the end of the wing attached to the satellite, and one solar panel PSC is provided exclusively with solar cells with no luminous energy concentration means.

During a phase with depointing, such a solar generator wing thus supplies three quarters less electrical energy because the three solar panels PAC provided exclusively with solar cells provided with luminous energy concentration means no longer supply electrical energy.

FIG. 3g shows a solar generator wing GS provided with five solar panels arranged in the shape of a T the base of which is at the end of the wing attached to the satellite.

One panel PAC is provided exclusively with solar cells provided with luminous energy concentration means and is disposed in the middle of the horizontal bar of the T.

The other four solar panels PSC are provided exclusively with solar cells with no luminous energy concentration means.

During a phase with depointing, such a solar generator wing thus supplies a fifth less electrical energy, because the solar panel PAC provided exclusively with solar cells provided with luminous energy concentration means no longer supplies electrical energy.

FIG. 3h shows a solar generator wing GS provided with five solar panels arranged in a T shape the base of which is at the end of the wing attached to the satellite.

Two panels PAC are provided exclusively with solar cells provided with luminous energy concentration means and are disposed in the middle of the horizontal bar of the T and just underneath in the vertical bar of the T.

The other three solar panels PSC are provided exclusively with solar cells with no luminous energy concentration means.

During a phase with depointing, such a solar generator wing thus supplies two fifths less electrical energy, because the two solar panels PAC provided exclusively with solar cells provided with luminous energy concentration means no longer supply electrical energy.

FIG. 3i shows a solar generator wing GS provided with five solar panels arranged in the shape of a T the base of which is at the end of the wing attached to the satellite.

Two panels PAC are provided exclusively with solar cells provided with luminous energy concentration means and are disposed at the ends of the horizontal bar of the T. The other three solar panels PSC are provided exclusively with solar cells with no luminous energy concentration means.

During a phase with depointing, such a solar generator wing thus provides two fifths less electrical energy, because the two solar panels PAC provided exclusively with solar cells provided with luminous energy concentration means no longer supply electrical energy.

FIG. 3j shows a solar generator wing GS provided with five solar panels arranged in the shape of a T the base of which is at the end of the wing attached to the satellite.

Three panels PAC are provided exclusively with solar cells provided with luminous energy concentration means and are disposed on the vertical bar of the T. The other two solar panels PSC are provided exclusively with solar cells with no luminous energy concentration means.

During a phase with depointing, such a solar generator wing thus supplies three fifths less electrical energy, because the three solar panels PAC provided exclusively with solar cells provided with luminous energy concentration means no longer supply electrical energy.

FIG. 3k shows a solar generator wing GS provided with five solar panels arranged in the shape of a T the base of which is at the end of the wing attached to the satellite.

One solar panel PSC is provided exclusively with solar cells with no luminous energy concentration means and is disposed in the middle of the horizontal bar of the T.

The four panels PAC are provided exclusively with solar cells provided with luminous energy concentration means.

During a phase with depointing, such a solar generator wing thus supplies four fifths less electrical energy, because the four solar panels PAC provided exclusively with solar cells provided with luminous energy concentration means no longer supply electrical energy.

FIG. 3l shows a solar generator wing GS provided with six solar panels arranged in the shape of a cross the base of which is at the end of the wing attached to the satellite.

Three solar panels PAC are provided exclusively with solar cells provided with luminous energy concentration means and are disposed in the bottom part of the vertical bar of the cross.

The other three panels PSC are provided exclusively with solar cells with no luminous energy concentration means.

During a phase with depointing, such a solar generator wing thus supplies half as much electrical energy, because the three solar panels PAC provided exclusively with solar cells provided with luminous energy concentration means no longer supply electrical energy.

FIG. 3m shows a solar generator wing GS provided with six solar panels arranged in the shape of a cross the base of which is at the end of the wing attached to the satellite.

Four solar panels PAC are provided exclusively with solar cells provided with luminous energy concentration means, three of which form the horizontal bar of the cross and the fourth of which is disposed above on the vertical bar of the cross.

The other two panels PSC are provided exclusively with solar cells with no luminous energy concentration means.

During a phase with depointing, such a solar generator wing thus provides two thirds less electrical energy, because the four solar panels PAC provided exclusively with solar cells provided with luminous energy concentration means no longer supply electrical energy.

FIG. 3n shows a solar generator wing GS provided with six solar panels arranged in the shape of a cross the base of which is at the end of the wing attached to the satellite.

Five solar panels PAC are provided exclusively with solar cells provided with luminous energy concentration means, three of which form the horizontal bar of the cross, the fourth of which is disposed underneath on the vertical bar of the cross and the fifth of which is disposed above on the vertical bar of the cross.

The other panel PSC is provided exclusively with solar cells with no luminous energy concentration means.

During a phase with depointing, such a solar generator wing thus supplies five sixths less electrical energy, because the five solar panels PAC provided exclusively with solar cells provided with luminous energy concentration means no longer supply electrical energy.

FIG. 3o shows a solar generator wing GS provided with seven solar panels arranged so that three panels are connected in linear fashion and the two panels at the end of this connection of three panels, the base of which is at the end of the wing attached to the satellite, are respectively framed by two panels.

Four solar panels PAC are provided exclusively with solar cells provided with luminous energy concentration means, two of which are at the end of the linear connection and the other two of which frame the panel in the middle of the linear connection.

The other three panels PSC are provided exclusively with solar cells with no luminous energy concentration means.

During a phase with depointing, such a solar generator wing thus supplies four sevenths less electrical energy, because the five solar panels PAC provided exclusively with solar cells provided with luminous energy concentration means no longer supply electrical energy.

FIG. 3p shows a solar generator wing GS provided with seven solar panels arranged so that three panels are connected in linear fashion and the two panels at the end of this connection of three panels, the base of which is at the end of the wing attached to the satellite, are respectively framed by two panels.

Five solar panels PAC are provided exclusively with solar cells provided with luminous energy concentration means, three of which form the linear connection and the other two of which frame the panel in the middle of the linear connection.

The other two panels PSC are provided exclusively with solar cells with no luminous energy concentration means.

During a phase with depointing, such a solar generator wing thus supplies five sevenths less electrical energy, because the five solar panels PAC provided exclusively with solar cells provided with luminous energy concentration means no longer supply electrical energy.

FIG. 3q shows a solar generator wing GS provided with seven solar panels arranged so that three panels are connected in linear fashion and the two panels at the end of this connection of three panels, the base of which is at the end of the wing attached to the satellite, are respectively framed by two panels.

Six solar panels PAC are provided exclusively with solar cells provided with luminous energy concentration means, two of which are at the beginning of the linear connection and the other four of which are the other panels not forming part of the linear connection.

The panel PSC is provided exclusively with solar cells with no luminous energy concentration means.

During a phase with depointing, such a solar generator wing thus supplies six sevenths less electrical energy, because the five solar panels PAC provided exclusively with solar cells provided with luminous energy concentration means no longer supply electrical energy.

Accordingly, depending on the characteristics and requirements of the satellite, the various embodiments enable a solar generator to be provided enabling sufficient electrical energy to be supplied even during a depointing phase.

The invention claimed:

1. A spacecraft comprising a hybrid assembly equipped with at least one solar panel, said assembly comprising:
    at least one solar cell provided with luminous energy concentration means and
    at least one solar cell with no luminous energy concentration means.

2. A spacecraft according to claim 1, wherein said luminous energy concentration means comprise at least one reflector.

3. A spacecraft according to claim 1, wherein said luminous energy concentration means comprise at least one concentrator.

4. A spacecraft according to claim 3, wherein said concentrator comprises at least one optical lens.

5. A spacecraft according to claim 4, wherein said lens is a Fresnel lens and comprises at least one part in pliable flexible material and a device for deployment of said lens.

6. A spacecraft according to claim 1, comprising at least one solar panel provided exclusively with solar cells provided with luminous energy concentration means and at least one solar panel provided exclusively with solar cells with no luminous energy concentration means.

7. A method of generation of electrical energy for spacecraft by hybridization of electrical energy generated by at least one solar cell provided with luminous energy concentration means and at least one solar cell with no luminous energy concentration means.

* * * * *